(12) United States Patent
Ohtani et al.

(10) Patent No.: US 6,225,966 B1
(45) Date of Patent: May 1, 2001

(54) DISPLAY DEVICE

(75) Inventors: Hisahi Ohtani; Yasushi Ogata; Takeshi Nishi; Yutaka Shionoiri, all of Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/046,196

(22) Filed: Mar. 23, 1998

(30) Foreign Application Priority Data

Mar. 26, 1997 (JP) ..................................... 9-092934

(51) Int. Cl.[7] .............. G09G 3/36; G02F 1/136
(52) U.S. Cl. ................ 345/87; 345/55; 345/92; 349/42; 349/43
(58) Field of Search .................. 345/55, 87, 92, 345/76; 349/43, 42, 113; 348/752; 438/166

(56) References Cited

U.S. PATENT DOCUMENTS

| | | | |
|---|---|---|---|
| 5,193,017 | * 3/1993 | Iwai et al. ............................ | 349/43 |
| 5,327,268 | * 7/1994 | Takabatake et al. ................ | 349/42 |
| 5,408,345 | * 4/1995 | Mitsui et al. ....................... | 349/42 |
| 5,426,526 | * 6/1995 | Yamamoto et al. ................. | 349/42 |
| 5,777,696 | * 7/1998 | Inoue et al. ........................ | 348/752 |
| 5,786,242 | * 7/1998 | Takemura et al. .................. | 438/166 |
| 5,805,252 | * 9/1998 | Shimada et al. ................... | 349/113 |

* cited by examiner

Primary Examiner—Steven Saras
Assistant Examiner—Alecia D. Nelson
(74) Attorney, Agent, or Firm—Fish & Richardson P.C.

(57) ABSTRACT

In a reflection type liquid crystal panel, the flatness of a surface of a pixel electrode is secured. A drain electrode is extended to the lower portion of a reflecting pixel electrode. The drain electrode and an auxiliary capacitance electrode form an auxiliary capacitance. The drain electrode, a gate electrode, and a source wiring line exist, so that the roughness of the surface on which a resin layer is formed, is relaxed, and the securing of flatness by the resin layer is made easy. In this way, the reflecting pixel electrode can be formed on the flat surface.

29 Claims, 9 Drawing Sheets

DISPLAY DEVICE

BACKGROUND OF THE INVENTION

1. Field of the Invention

The present invention relates to a structure of an active matrix type reflection type liquid crystal panel.

2. Description of the Related Art

FIG. 8 schematically shows a section of a conventional active matrix type reflection type liquid crystal panel. In the structure shown in FIG. 8, a TFT (thin film transistor) constituted by a source region 708, a gate electrode portion 709, and a drain region 710 is disposed, and further a reflecting pixel electrode 706 is connected to the drain region 710 of the TFT.

Generally, in such a structure, the flatness of upper surfaces of the source electrode portion 708, the gate electrode portion 709, and the drain electrode portion 710, as well as the flatness between the pixel region 711 and other region is not considered much as shown in the drawing.

The disturbance of the flatness (that is, roughness) generally becomes about 300 nm to 700 nm.

The existence of such roughness causes disturbance 707 of liquid crystal molecules. However, in the case where the thickness of a liquid crystal layer is as thick as 7 $\mu$m or 8 $\mu$m or more, the roughness does not greatly influence the display.

That is, the influence of the disturbance of the liquid crystal molecules is not applied to the entire of the liquid crystal layer in the thickness direction, and the disturbance does not have much influence on the display.

However, in recent years, according to the pursuance of a high picture quality and the development of a liquid crystal material accompanying the pursuance, it is required to narrow the thickness of a liquid crystal layer further.

Especially, in a reflection type liquid crystal panel, since light passes through a liquid crystal layer twice, it is required to make the thickness ½ times that of a transmission type liquid crystal panel (although the actual situation is not so simple, the outline is true.)

Until now, the reflection type liquid crystal panel has not been required to have fine display characteristics and high speed moving picture display. Thus, it has not been necessary to compulsorily thin the liquid crystal layer to improve the display characteristics.

According to the knowledge of the present inventors et al, it is found that the reflection type liquid crystal panel is suitable for use in a projection type projector.

This is because the projector is required to have a compact picture size (if the picture size is large, the optical system becomes expensive), and with respect to a small picture size such as 2.5 inches or less in diagonal, the aperture ratio of the reflection type liquid crystal panel can be made higher than that of the transmission type.

In general, when the size of the picture becomes small, the rate of regions through which light does not pass, such as a TFT, a wiring line, and a capacitance electrode, becomes large in the transmission type, and the transmission loss in a transmission portion becomes also tangible. (According to the calculation by the present inventors, this tendency becomes tangible when the size of the picture becomes 2.5 inches or less.)

On the other hand, in the reflection type, it is possible to dispose a TFT, a wiring line, and a capacitance electrode at the lower portion of a reflecting electrode, and the reflection loss of the reflecting electrode can be made far smaller than the transmission loss of the transmission type.

A projector is required to have a performance to make high minute display. Thus, a reflection type liquid crystal panel used for the projector is required to have high display characteristics. Especially in the case of the projector, since a picture image is magnified several tens to 100 or more times, this request becomes severe.

By such reasons, high display characteristics are required also for the reflection type liquid crystal panel, and the thickness of a liquid crystal layer is required to be made thin to realize the request.

According to the knowledge of the present inventors, in order to obtain the required display characteristics, in the case of the reflection type liquid crystal panel, it is required to make the thickness of the liquid crystal layer about 2 to 4 $\mu$m. This is required from the condition under which a contrast becomes highest.

In this case, if a level difference of the roughness at the surface in contact with the liquid crystal layer is 10% or more of the liquid crystal layer, the disturbance of liquid crystal orientation becomes tangible, and the deterioration of picture quality (especially the lowering of contrast) becomes remarkable.

The thickness "d" of the liquid crystal layer is determined by the condition under which the contrast becomes highest. The condition for maximizing the contrast is determined by the product ($\Delta$nd) of $\Delta$n (retardation) determined by the liquid crystal material and the thickness "d" of the liquid crystal layer. However, this value has a wavelength dependency, and has trouble properties that the dependency is different among liquid crystal materials, so that the optimization is not simple.

FIG. 7 shows the result of simulation assuming the reflection type liquid crystal panel. Here, the horizontal axis indicates the wavelength of incident light, and the vertical axis indicates the ratio of the incident light to output light (the ratio is defined as a transmissivity).

The plotting dots in FIG. 7 show various cases where the thicknesses of liquid crystal layers are changed.

The wavelength sensibility of a human eye is within the range of about 450 to 680 nm, and has a maximum value in the vicinity of 550 nm.

Thus, in the case where color display is made, it is important that the transmissivity within the range of 450 to 680 nm is as flat as possible in the curves as shown in FIG. 7.

Especially, the flatness within the range of 500 to 600 nm in which the wavelength sensibility is high, becomes important.

Of course, it is important that the transmissivity is as high as possible (that is, the transmission loss is as low as possible).

When this point is considered, in the result of simulation shown in FIG. 7, the cases in which the thickness of the liquid crystal layer is 2.86 $\mu$m and 3 $\mu$m, become preferable. Besides, the cases in which the thickness of the liquid crystal layer is 2.5 $\mu$m and 3.5 $\mu$m, can be used though not quite satisfactorily.

For example, in the case where the thickness of the liquid crystal layer is made 3 $\mu$m, it is required that the roughness of the surface in contact with the liquid crystal layer is made 0.3 $\mu$m (300 nm) at most.

If this request is not satisfied, the roughness of the surface in contact with the liquid crystal layer as shown in FIG. 8 has a bad influence on the display.

As one of the methods of solving this problem, it is conceivable that a material such as a resin having fluidity at the film formation is used as an interlayer insulating film 712, so that a difference in level is absorbed.

However, for that purpose, the interlayer insulating film must be made considerably thick.

If the interlayer insulating film is made thick, an opening groove through which the pixel electrode 706 finally comes in contact with the drain electrode, becomes deep. This causes bad contact so that it is not preferable.

Especially, in the case of a miniaturized and minute structure with a small size of 2.5 inches or less in diagonal, such as a liquid crystal panel for a projector, the problem of the contact becomes tangible.

As described above, it is difficult to flatten the surface in contact with the liquid crystal, because of the relation to other requirements.

SUMMARY OF THE INVENTION

An object of the present invention is therefore to provide a structure of a display in which the above problem can be solved, and a surface in contact with a liquid crystal can be made flat while satisfying other requirements.

According to a first aspect of the present invention, as shown in FIGS. 1 to 6 in which manufacturing steps are exemplified, a display device comprises: a source wiring line 305 and a gate wiring line 204 arranged like a lattice (see FIG. 3); a thin film transistor including a source region 207 connected to the source wiring line 305 and a gate electrode 202 connected to the gate wiring line 204; a drain electrode 303 formed at the same time as the source wiring line 305 (see FIG. 6); an auxiliary capacitance electrode 401 formed over the drain electrode 303 (see FIG. 6); and a reflecting pixel electrode 602 formed over the auxiliary capacitance electrode 401 (see FIG. 6), wherein an auxiliary capacitance is formed between the drain electrode 303 and the auxiliary capacitance electrode 401 (see FIG. 6), and the drain electrode 303 occupies most of a pixel region (see FIG. 3).

In the structure described above, the source wiring line 305 and the gate wiring line 204 have a lattice shape in which linear shapes intersect with each other. However, a lattice-like arrangement is not limited to this structure. For example, such an arrangement that at least one is a bent pattern, may be adopted As a structure of wiring lines, both a single-layer structure and a multi-layer structure are possible. In the structure shown in FIG. 3, the gate wiring line is formed of a single layer of an aluminum film. The gate electrode 202 is formed as a pattern extending from the gate wiring line 204.

In the structure shown in FIG. 3, the source wiring line 305 is formed of a lamination film of a titanium film 302, an aluminum film 303, and a titanium film 304. In FIG. 3, as the source wiring line, the portion 305 made of aluminum material constituting the main part of the wiring line is shown (upper and lower titanium films are omitted).

As a structure of a thin film transistor (called a TFT), in addition to the basic structure as shown in FIG. 2 in which a channel region (existing in the lower portion of the gate electrode 202) is disposed between the source region 207 and the drain region 205 (existing in the lower portion of a contact 308), it is possible to exemplify the structure as shown in FIG. 10 in which an active layer 11 is bent.

Alternatively, it is possible to use a structure in which a gate electrode is provided at plural portions in the same active layer 11 as shown in FIG. 10, so that a plurality of TFTs are connected substantially in series. As the structure of a TFT, a reverse-stagger type may be used.

Further, in the structure of the first aspect, "the drain electrode 303 formed at the same time as the source wiring line 305 (see FIG. 6)" is obtained, as shown in FIG. 3, by patterning the film formed on the same surface (in this case, on an interlayer insulating film 301) to form patterns designated by 303 and 305.

The confirmation of the concurrent formation can be made if a picture of an enlarged section is taken by using an electron microscope.

That the drain electrode 303 occupies most of a pixel region (see FIG. 3) means such a structure that as exemplified in FIG. 3, when the region surrounded by the source wiring line and the gate wiring line is defined as the pixel region, the drain electrode occupies at least 50%, preferably at least 70% of the pixel region.

Since the reflecting pixel electrode overlaps with a part of the source wiring line and the gate wiring line, the circumference of the pixel region (edge portion) overlaps partially with the source wiring line and the gate wiring line.

In the structure of the first aspect, as shown in the lower part of FIG. 6, the auxiliary capacitance is formed as a structure in which a silicon nitride film 400 as a dielectric film is placed between the drain electrode 303 and the auxiliary capacitance electrode 401.

Further, in the structure shown in FIG. 6, the upper portion of the auxiliary capacitance is made flat by a polyimide resin film 501.

According to a second aspect of the present invention, a display device comprises: a source wiring line and a gate wiring line arranged like a lattice; a thin film transistor including a source region connected to the source wiring line and a gate electrode connected to the gate wiring line; a drain electrode formed at the same time as the source wiring line; an auxiliary capacitance electrode formed over the drain electrode; a conductive film for electromagnetic shied formed over the auxiliary capacitance electrode; and a reflecting pixel electrode formed over the conductive film, wherein an auxiliary capacitance is formed between the drain electrode and the auxiliary capacitance electrode, and the drain electrode occupies most of a pixel region.

The conductive film for electromagnetic shield is a film designated by 502 in FIG. 6. This conductive film 502 has such a structure as to cover all regions except a contact portion 603 between a pixel electrode 602 and the drain electrode 303.

By doing so, it is possible to suppress the electrical interference between the pixel electrode and the TFT in addition to the pixel electrode and the source wiring line.

According to a third aspect of the present invention, a display device comprises: a source wiring line and a gate wiring line arranged like a lattice; a thin film transistor including a source region connected to the source wiring line and a gate electrode connected to the gate wiring line; a drain electrode formed at the same time as the source wiring line; an auxiliary capacitance electrode formed over the drain electrode through a dielectric film; a conductive film for electromagnetic shield formed over the auxiliary capacitance electrode; and a reflecting pixel electrode formed over the conductive film, wherein an auxiliary capacitance is formed between the drain electrode and the auxiliary capacitance electrode, the drain electrode occupies most of a pixel region, and the flatness of a surface on which the dielectric film is formed, is secured by the gate electrode, the source wiring line, and the drain electrode.

This structure is characterized in that, in the structure exemplified in FIG. 6, the drain electrode 303 and the source wiring line 305 are formed so that the upper surfaces thereof are matched with the raised portion of the interlayer insulating film 301, which is produced by the existence of the gate electrode 202, to compensate the roughness of the surface on which the silicon nitride film 400 is formed, and therefore the resin film 501 can satisfactorily absorb the remaining roughness.

In this case, it is necessary to match the thickness of the gate electrode 202 with the total thickness of the aluminum film and the titanium films formed on and under the aluminum film in some degree.

According to a fourth aspect of the present invention, a display device comprises: a source wiring line and a gate wiring line arranged like a lattice; a thin film transistor including a source region connected to the source wiring line and a gate electrode connected to the gate wiring line; a drain electrode formed at the same time as the source wiring line; an auxiliary capacitance electrode formed over the drain electrode through a dielectric film; a conductive film for electromagnetic shield formed over the auxiliary capacitance electrode; and a reflecting pixel electrode formed over the conductive film, wherein an auxiliary capacitance is formed between the drain electrode and the auxiliary capacitance electrode, the drain electrode occupies most of a pixel region, and a difference in thickness among the gate electrode, the source wiring line, and the drain electrode is not larger than 20% of the thickness of a liquid crystal layer.

This structure is characterized in that the thickness of the gate electrode 202 (including the thickness of an anodic oxidation film in the case exemplified in FIG. 6) is made even with the thickness of the drain electrode 303 (including the upper and lower titanium films in the case exemplified in FIG. 6), and the difference therebetween is made 20% or less of the thickness of the liquid crystal layer.

In the structure as exemplified in the lower part of FIG. 6, this structure is adopted to suppress such a disadvantage that in the case where the difference in thickness between the gate electrode 202 and the drain electrode 303 can not be absorbed by the upper resin film, a level difference generated by this becomes a level difference on the surface of the pixel electrode, and it causes poor orientation of the liquid crystal layer.

The value 20% or less is a value determined after considering the absorption of roughness by the resin layer when the finally remaining level difference of the roughness is made 10% or less. Of course, it becomes more preferable as the difference of the film thickness between the gate electrode and the drain electrode is made smaller.

Further, in the structure shown in FIG. 6 (or FIG. 5), the entire of the source line and the gate line is completely covered with the conductive film 502 for electromagnetic shield. Other portions except the drain contact portion of the TFT are also covered with the conductive film 502 for electromagnetic shield.

By making such a structure, it is possible to remove electrical interference between the pixel electrode and the source and drain electrodes. Besides, it is possible to remove electrical interference between the pixel electrode and the TFT.

DETAILED DESCRIPTION OF THE INVENTION

Preferred embodiments of the present invention will now be described with reference to the accompanying drawings.

Embodiment 1

Figure 6:
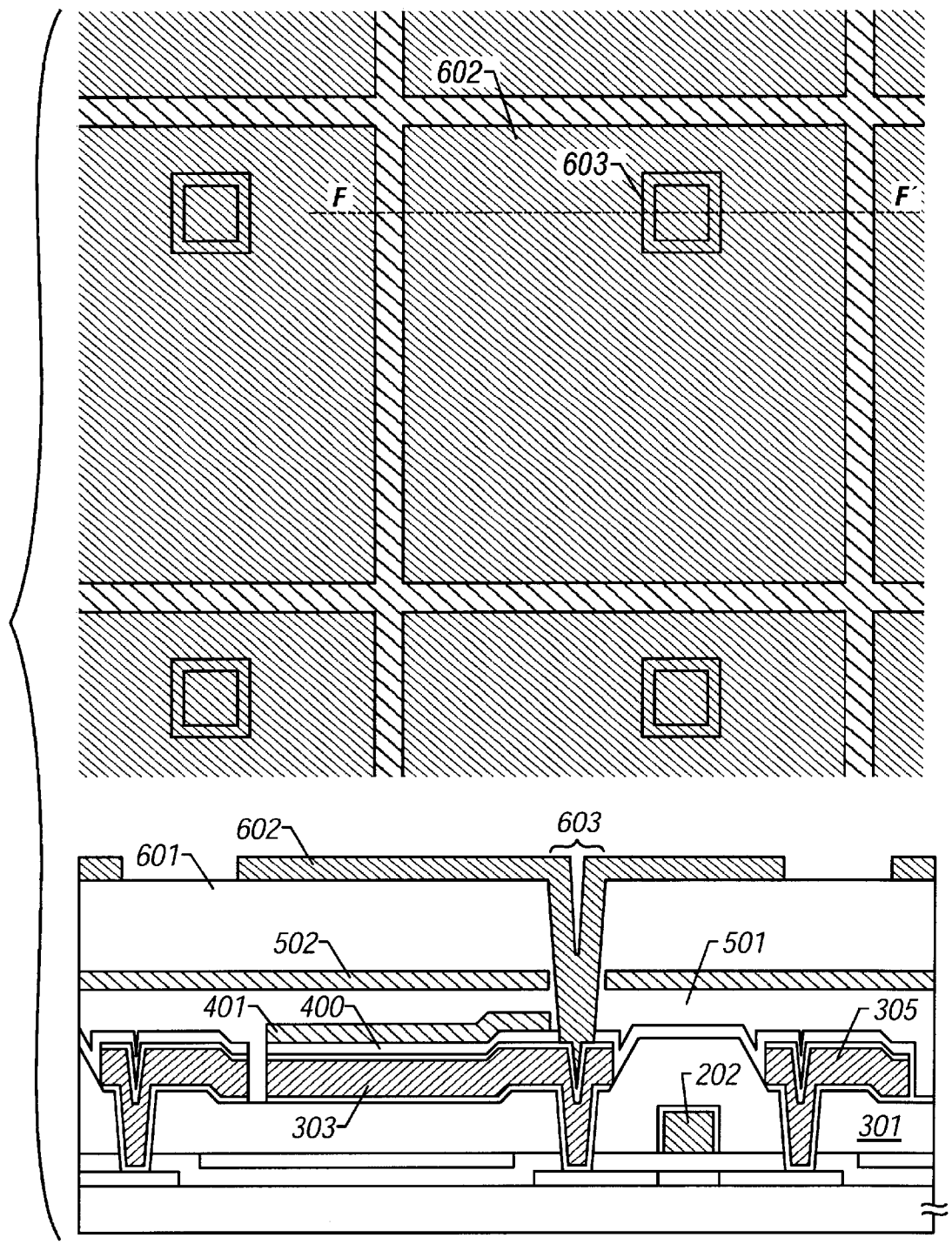
FIG. 6 is a view showing a manufacturing step of the liquid crystal panel.
Figure 7:
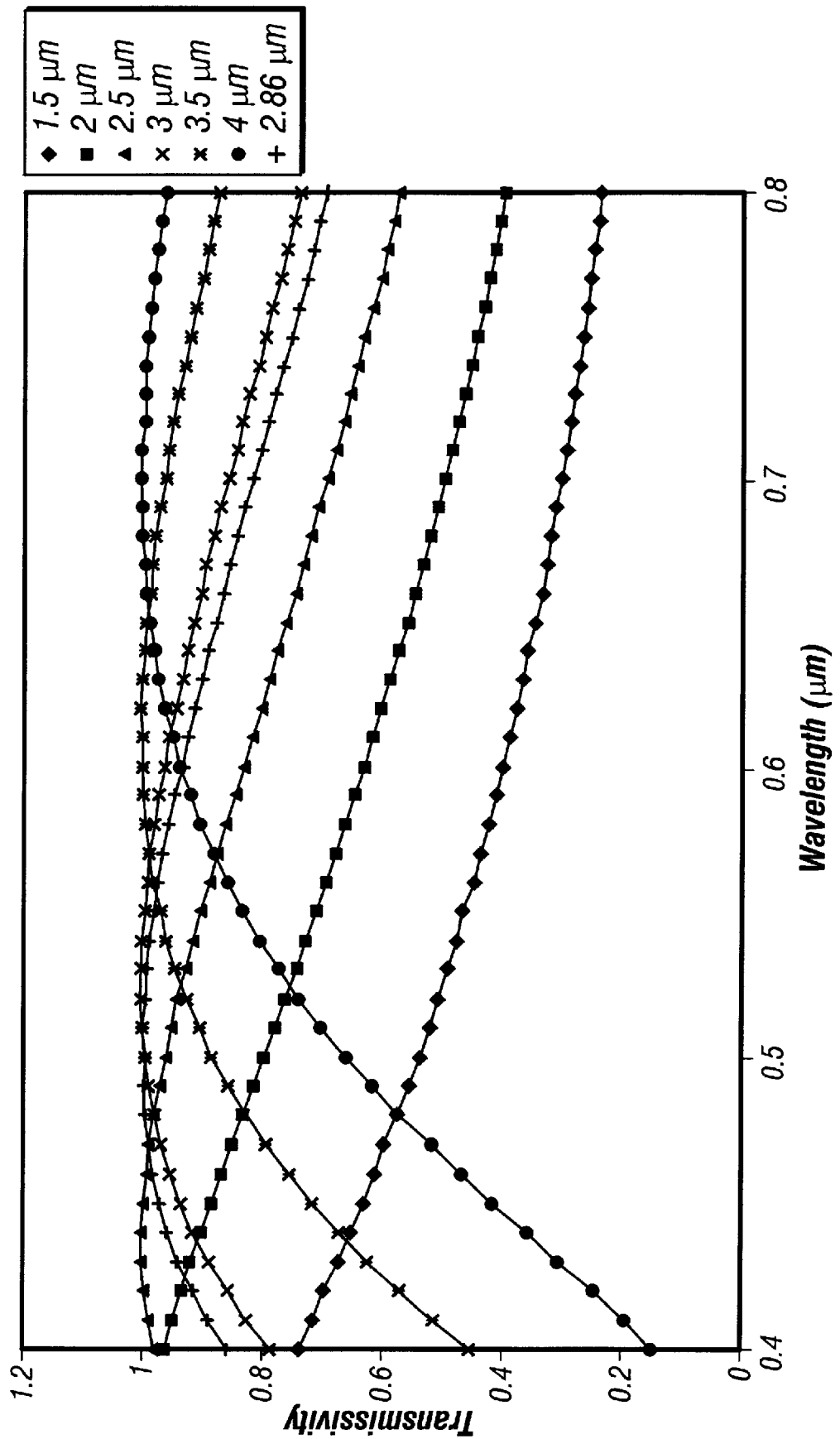
FIG. 7 is a view showing the result of simulation of the relation between the wavelength of light passing through a reflection type liquid crystal panel and the transmissivity, made by changing the thickness of a liquid crystal layer.
Figure 8:
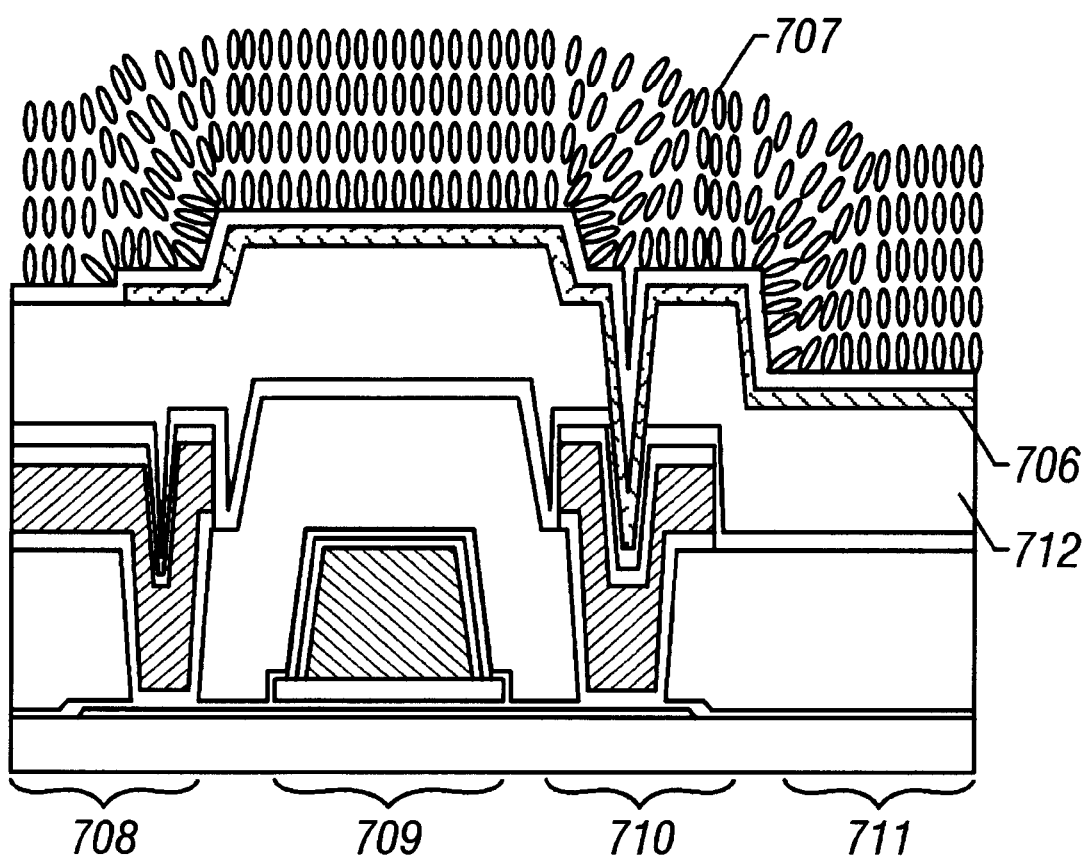
FIG. 8 is a view showing a sectional structure of a conventional reflection type liquid crystal panel.

The upper part of FIG. 6 shows an outline viewed from the above, and the lower part of FIG. 6 shows a section taken along line F–F'. As shown in the drawing, this embodiment has such a structure that a drain electrode of a TFT is made to extend into a portion under a pixel region, an auxiliary capacitance is formed by using the pattern, and the roughness of a surface of a pixel electrode is suppressed by the existence of the pattern.

Figure 1:
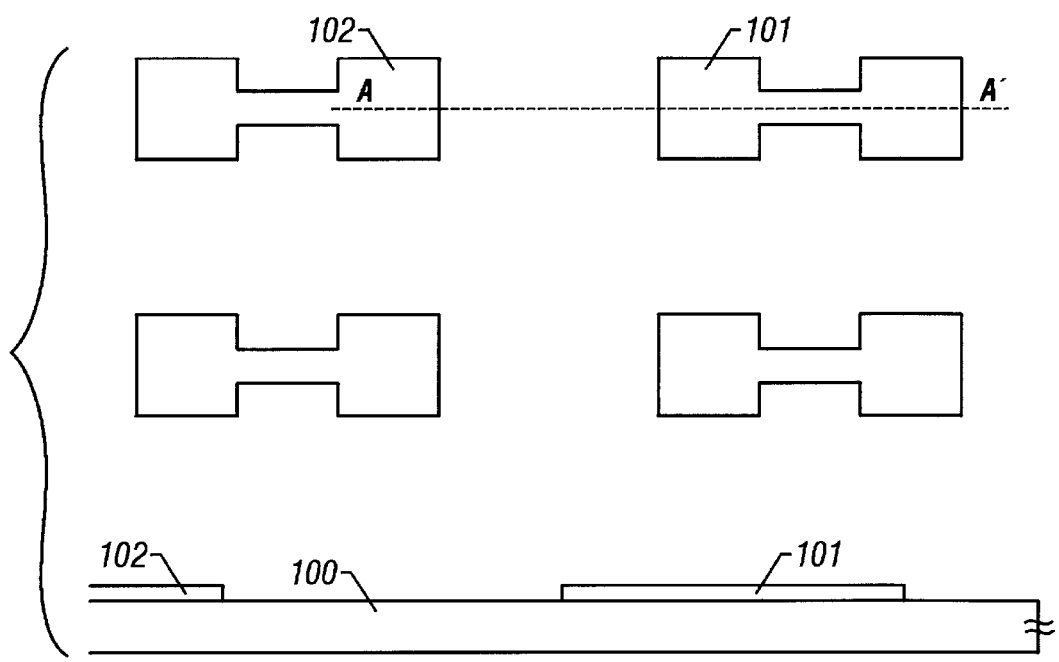
FIG. 1 is a view showing a manufacturing step of a liquid crystal panel.

In the following, the outline of manufacturing steps will be described with reference to FIGS. 1 to 6. First, as shown in FIG. 1, a region which becomes an active layer of a TFT, is formed. Here, the active layer of the TFT is formed by using a crystalline silicon film (with a thickness of 50 nm) obtained by crystallizing an amorphous silicon film.

Reference numerals 101 and 102 denote active layer patterns of the TFT. In this embodiment, an example in which an N-channel TFT is manufactured as the TFT, will be described.

The upper part of FIG. 1 shows the state viewed from the above. The lower part of FIG. 1 shows a section taken along line A–A' in the upper part. In the lower part of FIG. 1, reference numeral 100 denotes a glass substrate (or quartz substrate).

Figure 2:
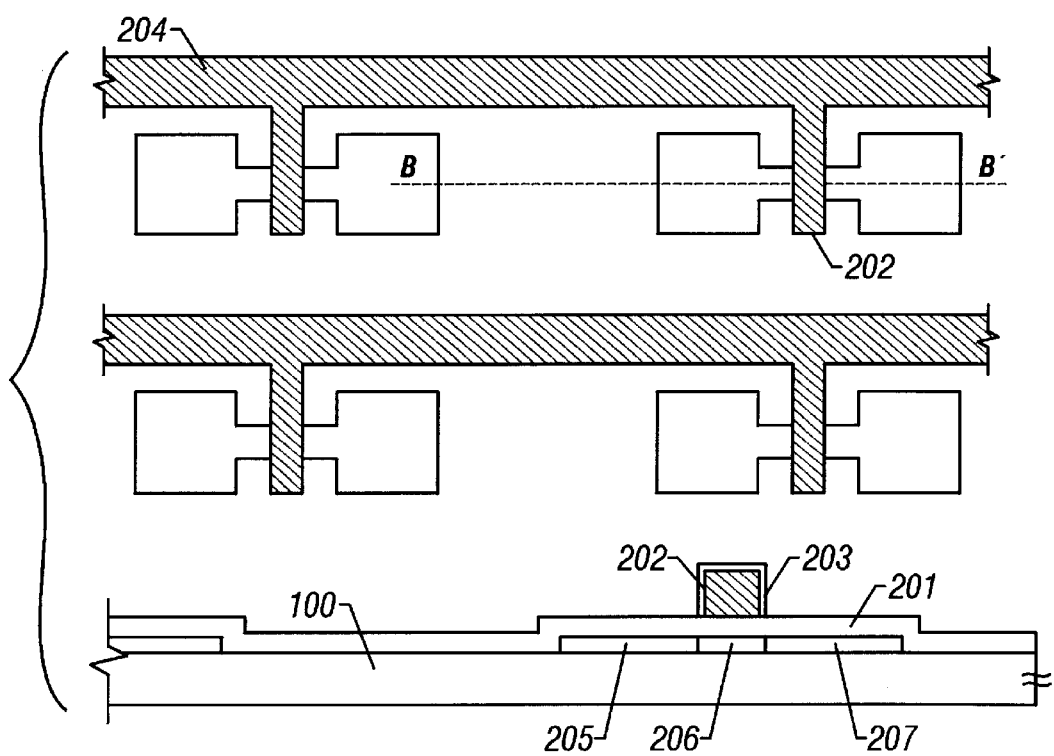
FIG. 2 is a view showing a manufacturing step of the liquid crystal panel.

After the state shown in FIG. 1 is obtained, as shown in the lower part of FIG. 2, a silicon oxide film 201 functioning as a gate insulating film is formed. Here, the film thickness of the silicon oxide film 201 is made 100 nm.

In FIG. 2, a section taken along line B–B' in the upper part is shown in a sectional view shown in the lower part.

After the silicon oxide film 201 is formed, a gate electrode 202 is made of aluminum. The thickness of an aluminum film forming the aluminum electrode is made 500 nm.

An anodic oxidation film 203 with a thickness of 50 nm is formed on the surface of the circumference of the gate electrode by using an anodic oxidation technique. The anodic oxidation film 203 has a function to protect the gate electrode 202 electrically and physically.

The gate electrode 202 is formed as an extension from a gate wiring line 204 as shown in the upper part of FIG. 2.

After the state shown in the lower part of FIG. 2 is obtained, doping of phosphorus is carried out by a plasma doping method to form a source region 207, a channel region 206, and a drain region 205 in a self-aligning manner.

After the doping is ended, irradiation of a laser beam is carried out to activate the doped phosphorus and to anneal the damage at the doping.

Figure 3:
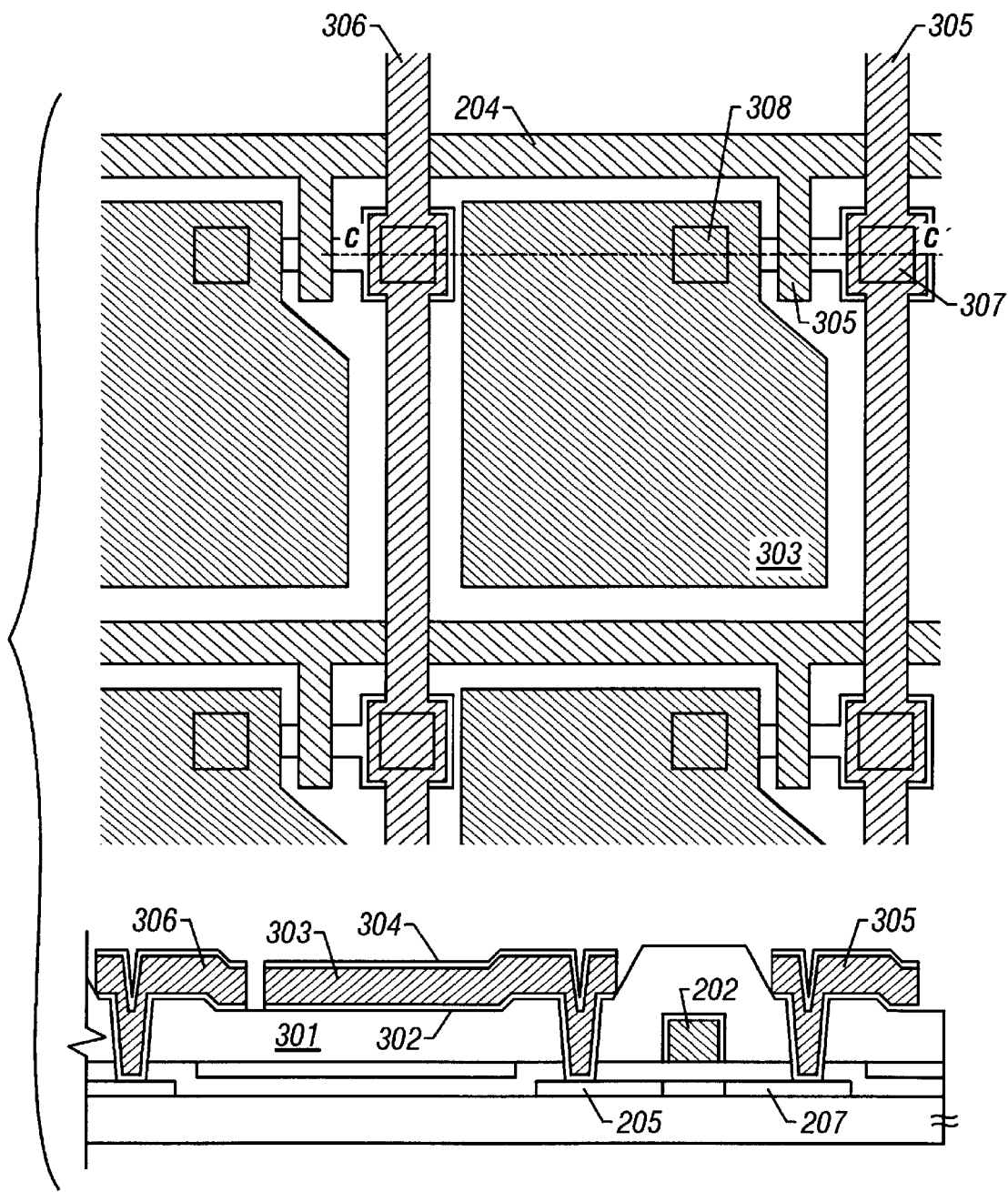
FIG. 3 is a view showing a manufacturing step of the liquid crystal panel.

In this way, the state shown in FIG. 2 is obtained. Next, as shown in FIG. 3, a silicon oxide film 301 with a thickness of 700 nm is formed as an interlayer insulating film by a plasma CVD method.

In the state where the silicon oxide film 301 is formed, the upper portion of the gate electrode 202 is a raised protrusion. The height of the raised portion becomes almost equal to the height (500 nm) of the gate electrode.

Next, a titanium film with a thickness of 50 nm, an aluminum film with a thickness of 400 nm, and a titanium film with a thickness of 50 nm are formed and stacked by a sputtering method. Then the films are patterned to form patterns 306, 303, and 305. (Here, patterns of only the aluminum film are shown, and the upper and lower titanium films are omitted.) Reference numerals 306, 303, and 305 in FIG. 3 designate the patterned aluminum films. Films in contact with the upper and lower surfaces of the aluminum film are titanium films. For example, a pattern 302 of the titanium film is formed on the lower surface of the aluminum pattern indicated by 303, and a pattern 304 of the titanium film is formed on the upper surface thereof.

The titanium film is used to make excellent contact.

A pattern made of an aluminum film is shown in the upper part of FIG. 3 (titanium film is not shown).

In FIG. 3, reference numerals 305 and 306 denote source wiring lines. The source wiring line 305 is connected to the source region of the TFT through a contact portion 307.

The lamination pattern of the patterns 302, 303, and 304 (drain electrode) are connected to the drain region of the TFT through a contact hole 308. As shown in the upper part of FIG. 3, the lamination pattern has a shape occupying most of the pixel region.

Here, the thickness of the gate electrode 202 is about 500 nm (the thickness is a little changed by the growth state of the anodic oxidation film).

The total film thickness of the aluminum pattern 306, 303, or 305 and the titanium films on and under the pattern is also 500 nm.

Accordingly, although some roughness is formed, in the state shown in the lower part of FIG. 3, large roughness (roughness having a difference in level extending to 100 nm or more) is not formed on the uppermost surface.

Thus, even when the liquid crystal layer is about 3 μm, it is possible to make a structure in which the influence of disturbance of liquid crystal molecules is not made tangible. A section taken along line C–C' in the upper part of FIG. 3 corresponds to the lower part of FIG. 3.

Figure 4:
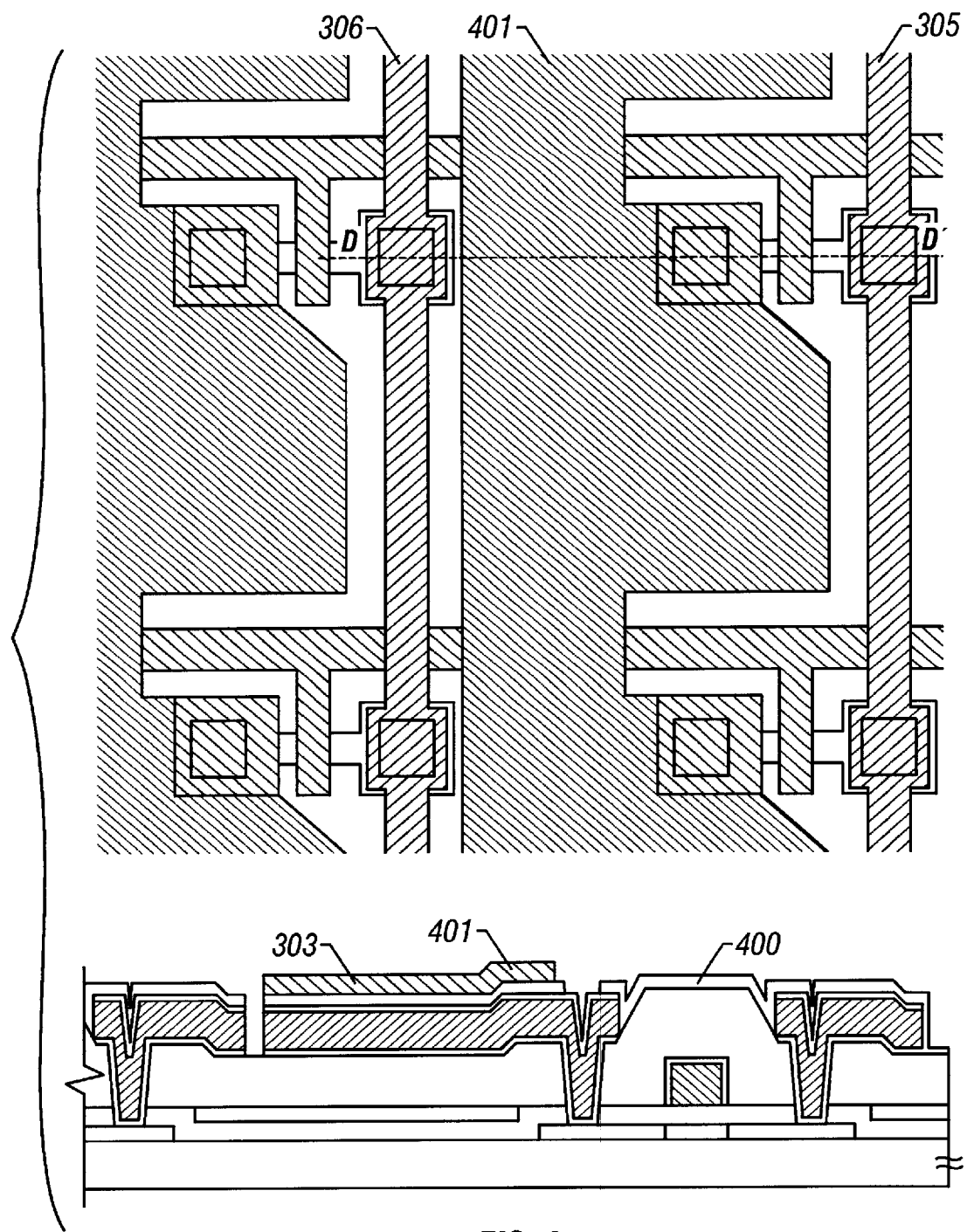
FIG. 4 is a view showing a manufacturing step of the liquid crystal panel.

After the state shown in FIG. 3 is obtained, a silicon nitride film 400 with a thickness of 50 nm is formed by a plasma CVD method (see the lower part of FIG. 4).

The silicon nitride film 400 functions as a dielectric material for an auxiliary capacitance. The thickness thereof is made as thin as 50 nm to increase the capacitance as much as possible.

Next, a titanium film with a thickness of 100 nm is formed by a sputtering method, and the film is patterned to form an electrode 401 for forming the auxiliary capacitance.

This electrode 401 extends in parallel to the source wiring lines 305 and 306 as shown in the upper part of FIG. 4.

A section taken along line D–D' in the upper part of FIG. 4 corresponds to the lower part of FIG. 4.

The electrode 401 and the drain electrode 303 connected to the drain region of the TFT are disposed so that the silicon nitride film with a thickness of 50 nm is placed therebetween, and they form the auxiliary capacitance.

The auxiliary capacitance is formed with a large area (except the region of the contact 308) designated by 303 in the upper part of FIG. 3, and the thickness of the silicon nitride film 400 is made thin, so that it is possible to easily secure necessary capacitance.

This becomes effective especially in the case where the liquid crystal panel is miniaturized and an area of each pixel becomes small.

Figure 5:
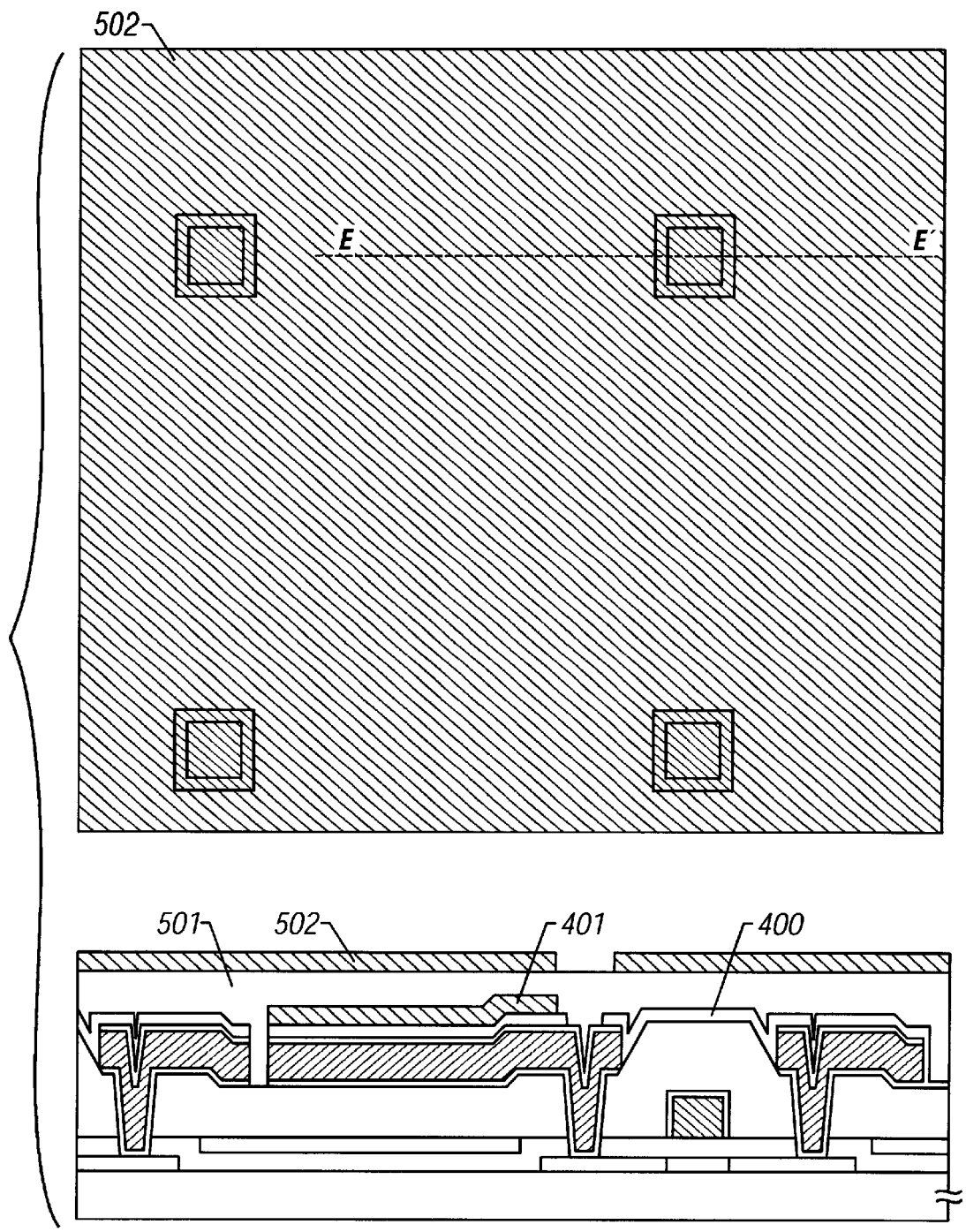
FIG. 5 is a view showing a manufacturing step of the liquid crystal panel.

Next, as shown in the lower part of FIG. 5, a film 501 made of polyimide resin is formed. The average film thickness is made 1 μm. A material other than polyimide, such as polyamide, polyimide amide, acryl, and epoxy may be used.

The polyimide film absorbs the roughness on the surface of the silicon nitride film 400 and the roughness due to the existence of the titanium film 401. That is, the polyimide film 501 having an almost flat surface is formed.

Next, a titanium film is formed, and is patterned to form a pattern 502 of a titanium film.

A section taken along line E–E' in the upper part of FIG. 5 is shown in the lower part of FIG. 5.

In this state, an opening is formed for contact of the drain region of the TFT.

The titanium film 502 is provided as an electromagnetic shield to prevent the pixel electrode formed on the titanium film from exerting an electrical interference to the source wiring line and the TFT.

After the state shown in FIG. 5 is obtained, as shown in the lower part of FIG. 6, a polyimide resin film 601 with an average thickness of 1.5 μm is formed, and further, a contact hole is formed. Then a reflecting pixel electrode 602 is formed by aluminum.

An aluminum film with a thickness of 2,000 Å formed by a sputtering method is used to constitute the pixel electrode 602.

A section taken along line F–F' in the upper part of FIG. 6 is shown in the lower part of FIG. 6.

In this structure, since the drain electrode 303 exists, it is possible to relatively easily form a contact at a portion 603. That is, it is not necessary to very deeply form an opening of the contact 603 of the reflecting pixel electrode 602, so that it is possible to easily form the contact (a narrow and deep opening causes poor contact).

The pixel electrode is disposed so that a part thereof overlaps with the edge of the source wiring line and the drain wiring line. By doing so, it is possible to increase the aperture ratio to the maximum.

After the state shown in FIG. 6 is obtained, a polyimide film (not shown) with a thickness of 120 nm is formed as an orientation film, and a rubbing treatment (orienting treatment) is carried out. At this time, since the flatness on the surface of the pixel electrode is maintained, it is possible to suppress partial poor orientation.

Subsequently, an opposite substrate is prepared, and liquid crystal is injected into the space between the structure shown in FIG. 6 and the opposite substrate to form a liquid crystal cell. In this way, a reflection type liquid crystal panel is completed.

Although a peripheral circuit for driving an active matrix circuit is not disclosed here, it is preferable to make such a structure that a peripheral driving circuit is also manufactured on the same substrate by TFTs. The peripheral circuit may be constituted by an external circuit of an IC chip.

Embodiment 2

Figure 10:
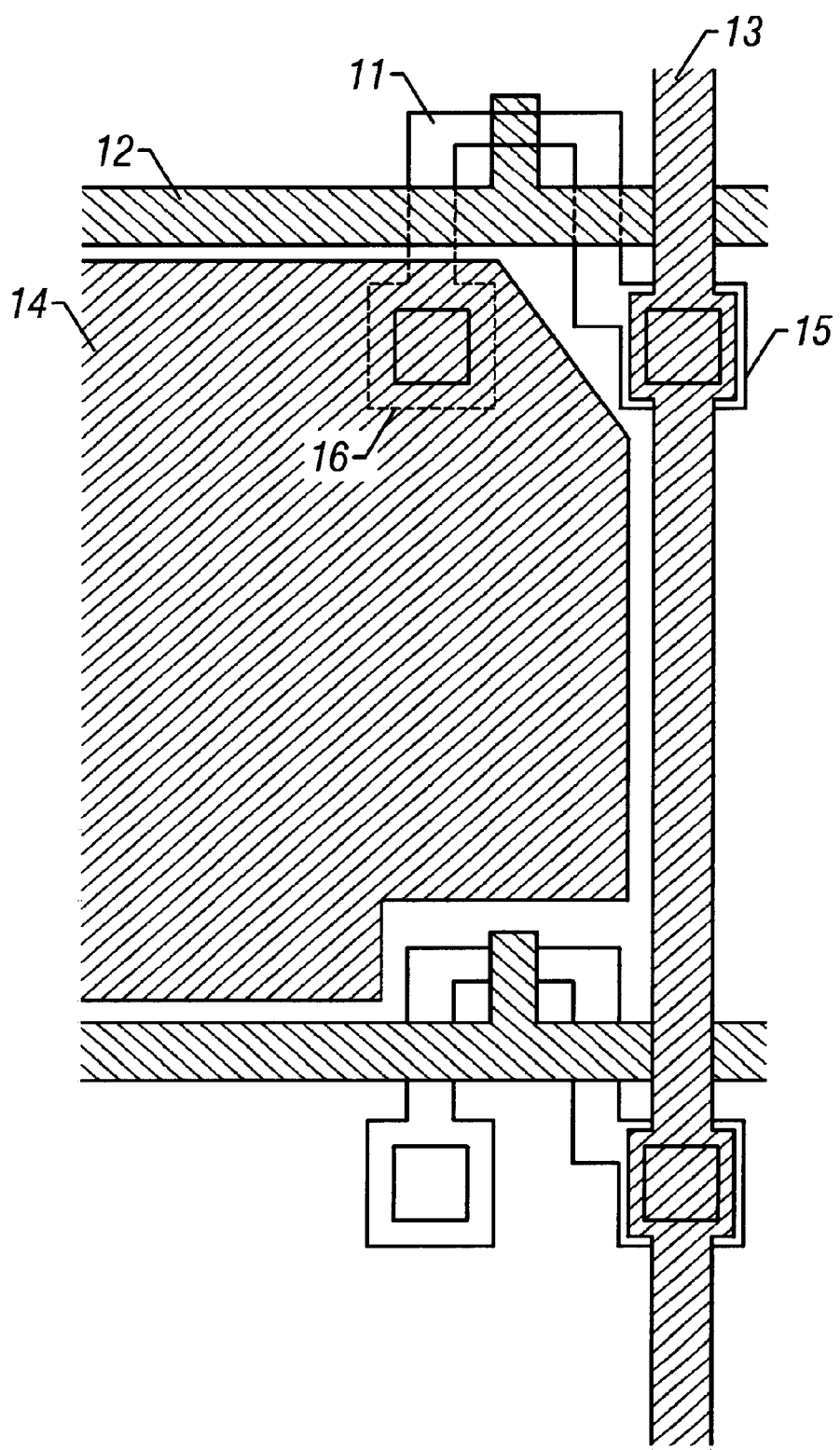
FIG. 10 is a view showing a variation of a TFT structure.

In this embodiment, an example of a TFT having a structure different from the embodiment 1, will be described. As shown in FIG. 10 in which the outline thereof is seen from the above, an active layer 11 intersects with a gate wiring line 12 at three portions, and gate electrodes are disposed at the portions.

This structure can be regarded equivalently as three TFTs connected in series.

In this structure, a region 15 in the active layer is defined as a source region, and a region 16 is defined as a drain region.

FIG. 10 shows a source wiring line 13 and a drain electrode 14 formed at the same time as the source wiring line.

The pattern of the drain electrode 14 is formed so that the drain electrode occupies most of a portion in a pixel electrode. The drain electrode corresponds to the pattern 303 in FIG. 3.

The drain electrode 14 has the following functions:
(1) forming an auxiliary capacitance,
(2) flattening the pixel electrode, and
(3) facilitating the contact formation of the pixel electrode.

In the structure as shown in FIG. 10, three channels are formed in the active layer 11, and one-third of the voltage applied between the source wiring line and the pixel electrode, is applied to the respective channels. By this, the withstand voltage of a TFT can be increased.

Embodiment 3

In this embodiment, examples of display devices using the reflection type liquid crystal panel obtained by using the present invention, will be described.

Figure 9A:
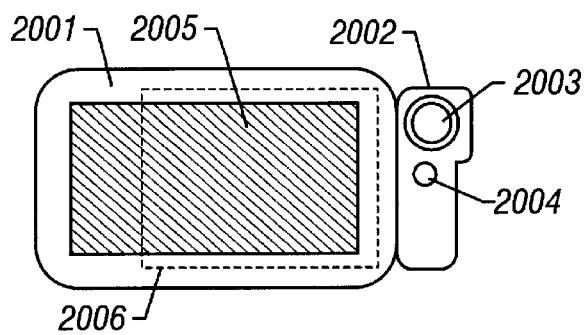
FIGS. 9A to 9F are views showing examples of devices including a liquid crystal panel using the present invention.

FIG. 9A shows a portable information processing terminal, which has a communication function using a telephone line.

This electric device includes an integrated circuit 2006 in the inside of a main body 2001. Further, this device includes a reflection type active matrix liquid crystal panel 2005 in which TFTs as switching elements are disposed, a camera portion 2002 for taking in a picture image, an image receiving portion 2003, and an operation switch 2004.

Figure 9B:
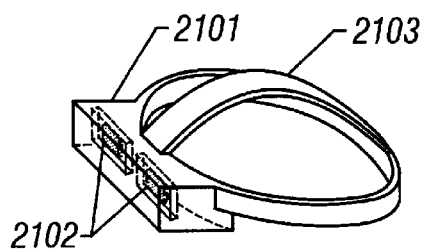

FIG. 9B shows an electric device called a head mount display. This device has a function to display a false picture image in front of eyes when a main body 2101 is mounted on a head through a band 2103. The picture image is formed by active matrix type liquid crystal panels 2102 corresponding to the right and left eyes.

Figure 9C:
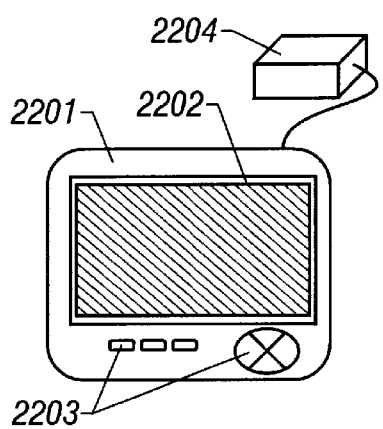

FIG. 9C shows an electric device having a function to display map information and various kinds of information based on signals from an artificial satellite. Information from an artificial satellite is received by an antenna 2204, and is processed by an electric circuit included in the inside of a main body 2201, and necessary information is displayed on an active matrix type reflection type liquid crystal panel 2202.

The operation of the device is carried out by an operation switch 2203. Even in such a device, a circuit using TFTs is used.

Figure 9D:
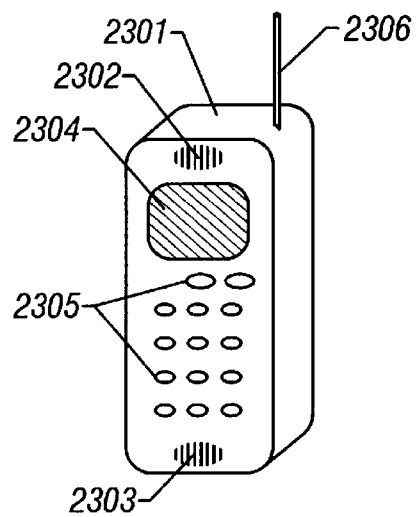

FIG. 9D shows a portable telephone. This electric device comprises a main body 2301, an antenna 2306, an audio output portion 2302, a liquid crystal panel 2304, an operation switch 2305, and an audio input portion 2303.

Figure 9E:
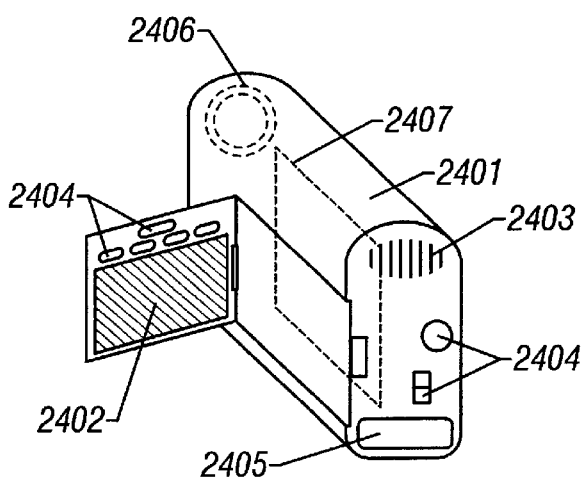

FIG. 9E shows an electric device of a portable imaging device called a video camera. This electric device includes a reflection type liquid crystal panel 2402 attached to a close-open member of a main body 2401, and an operation switch 2404 attached to the close-open member.

Further, the main body 2401 is provided with an image receiving portion 2406, an integrated circuit 2407, an audio input portion 2403, an operation switch 2404, and a battery 2405.

Figure 9F:
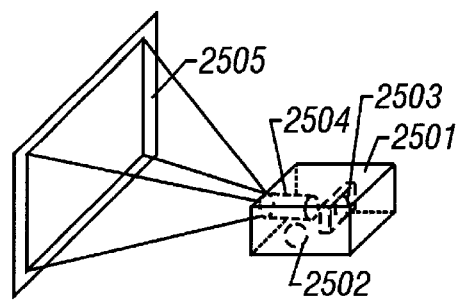

FIG. 9F shows an electric device of a projection type liquid crystal display device. This device includes a main body 2501 provided with a light source 2502, a reflection type liquid crystal panel 2503, and an optical system 2504, and has a function to project a picture image onto a screen 2505.

The present invention can also be used for a flat panel display other than the case of using a liquid crystal. For example, in an EL display, the present invention can be used when an under layer of a light emitting layer is flattened. The present invention can also be used for an EC display and the like.

That is, the present invention can be used for realizing the structure in which a surface over a pixel region is desired to make flat.

As described above, by using the present invention, it is possible to provide a reflection type liquid crystal panel in which a contact can be easily formed and the surface in contact with a liquid crystal can be made flat.

What is claimed is:
1. A display device comprising:
   a source wiring line and a gate wiring line arranged like a lattice;
   a thin film transistor including a source region connected to the source wiring line and a gate electrode connected to the gate wiring line;
   a drain electrode formed at the same time as the source wiring line;
   an auxiliary capacitance electrode disposed over the drain electrode; and
   a reflecting pixel electrode disposed over the auxiliary capacitance electrode and the drain electrode with an interlayer insulating film between the drain electrode and the reflecting pixel electrode,
   wherein an auxiliary capacitance is formed between the drain electrode and the auxiliary capacitance electrode, and
   wherein the drain electrode occupies most of a pixel region.
2. A device according to claim 1, wherein an upper portion of the auxiliary capacitance is made flat by an interlayer insulating film made of a resin material.
3. A display device comprising:
   a source wiring line and a gate wiring line arranged like a lattice;
   a thin film transistor including a source region connected to the source wiring line and a gate electrode connected to the gate wiring line;
   a drain electrode formed at the same time as the source wiring line;
   an auxiliary capacitance electrode disposed over the drain electrode;

a conductive film for electromagnetic shield disposed over the auxiliary capacitance electrode; and a reflecting pixel electrode disposed over the conductive film and the drain electrode with an interlayer insulating film between the drain electrode and the reflecting pixel electrode, wherein an auxiliary capacitance is formed between the drain electrode and the auxiliary capacitance electrode, and wherein the drain electrode occupies most of a pixel region.

4. A device according to claim 3, wherein the conductive film for electromagnetic shield is disposed to cover the source wiring line and the gate wiring line.

5. A device according to claim 3, wherein the conductive film for electromagnetic shield is disposed to cover the source wiring line, the gate wiring line, and a thin film transistor except a contact portion.

6. A device according to claim 3, wherein an upper portion of the auxiliary capacitance is flattened by an interlayer insulating film made of a resin material.

7. A display device comprising:

a source wiring line and a gate wiring line arranged like a lattice;

a thin film transistor including a source region connected to the source wiring line and a gate electrode connected to the gate wiring line;

a drain electrode formed at the same time as the source wiring line;

an auxiliary capacitance electrode disposed over the drain electrode through a dielectric film;

a conductive film for electromagnetic shield disposed over the auxiliary capacitance electrode; and a reflecting pixel electrode disposed over the conductive film and the drain electrode with an interlayer insulating film between the drain electrode and the reflecting pixel electrode, wherein an auxiliary capacitance is formed between the drain electrode and the auxiliary capacitance electrode, wherein the drain electrode occupies most of a pixel region, and wherein flatness of a surface on which the dielectric film is formed, is secured by the gate electrode, the source wiring line, and the drain electrode.

8. A device according to claim 7, wherein the conductive film for electromagnetic shield is disposed to cover the source wiring line and the gate wiring line.

9. A device according to claim 7, wherein the conductive film for electromagnetic shield is disposed to cover the source wiring line, the gate wiring line, and a thin film transistor except a contact portion.

10. A device according to claim 7, wherein an upper portion of the auxiliary capacitance is flattened by an interlayer insulating film made of a resin material.

11. A display device comprising:

a source wiring line and a gate wiring line arranged like a lattice;

a thin film transistor including a source region connected to the source wiring line and a gate electrode connected to the gate wiring line;

a drain electrode formed at the same time as the source wiring line;

an auxiliary capacitance electrode disposed over the drain electrode through a dielectric film;

a conductive film for electromagnetic shield disposed over the auxiliary capacitance electrode; and a reflecting pixel electrode formed over the conductive film and the drain electrode with an interlayer insulating film between the drain electrode and the reflecting pixel electrode, wherein an auxiliary capacitance is formed between the drain electrode and the auxiliary capacitance electrode, wherein the drain electrode occupies most of a pixel region, and wherein a difference in thickness among the gate electrode, the source wiring line, and the drain electrode is not larger than 20% of a thickness of a liquid crystal layer.

12. A device according to claim 11, wherein the conductive film for electromagnetic shield is disposed to cover the source wiring line and the gate wiring line.

13. A device according to claim 11, wherein the conductive film for electromagnetic shield is disposed to cover the source wiring line, the gate wiring line, and a thin film transistor except a contact portion.

14. A device according to claim 11, wherein an upper portion of the auxiliary capacitance is flattened by an interlayer insulating film made of a resin material.

15. A device according to claim 1, wherein said display device is an EL display device.

16. A device according to claim 1, wherein said device is one of a portable information processing terminal, a head-mount display, a car navigation system, a portable telephone, a video camera and a projector.

17. A device according to claim 3, wherein said display device is an EL display device.

18. A device according to claim 3, wherein said device is one of a portable information processing terminal, a head-mount display, a car navigation system, a portable telephone, a video camera and a projector.

19. A device according to claim 7, wherein said display device is an EL display device.

20. A device according to claim 7, wherein said device is one of a portable information processing terminal, a head-mount display, a car navigation system, a portable telephone, a video camera and a projector.

21. A device according to claim 11, wherein said device is one of a portable information processing terminal, a head-mount display, a car navigation system, a portable telephone, a video camera and a projector.

22. A device according to claim 1 wherein the drain electrode occupies at least 50% of a pixel region.

23. A device according to claim 3 wherein the drain electrode occupies at least 50% of a pixel region.

24. A device according to claim 7 wherein the drain electrode occupies at least 50% of a pixel region.

25. A device according to claim 11 wherein the drain electrode occupies at least 50% of a pixel region.

26. A display device comprising:

a semiconductor island provided over a substrate and comprising therein a source region, a drain region and a channel formation region provided between the source region and the drain region;

a gate electrode provided adjacent to the channel formation region with a gate insulating film therebetween;

a source wiring line and a gate wiring line arranged like a lattice, the source wiring line being connected to the source region, and the gate wiring line being connected to the gate electrode;

a drain electrode connected to the drain region and formed at the same time as the source wiring line;

an auxiliary capacitance electrode disposed over the drain electrode; and a reflecting pixel electrode disposed over the auxiliary capacitance electrode and the drain electrode with an interlayer insulating film between the drain electrode and the reflecting pixel electrode, wherein an auxiliary capacitance is formed between the drain electrode and the auxiliary capacitance electrode, and wherein the drain electrode occupies at least 50% of a pixel region.

27. A display device comprising:

a semiconductor island provided over a substrate and comprising therein a source region, a drain region, and a channel formation region provided between the source region and the drain region;

a gate electrode provided adjacent to the channel formation region with a gate insulating film therebetween;

a source wiring line and a gate wiring line arranged like a lattice, the source wiring line being connected to the source region, and the gate wiring line being connected to the gate electrode;

a drain electrode connected to the drain region and formed at the same time as the source wiring line;

an auxiliary capacitance electrode disposed over the drain electrode;

a conductive film for electromagnetic shield disposed over the auxiliary capacitance electrode; and a reflecting pixel electrode disposed over the conductive film and the drain electrode with an interlayer insulating film between the drain electrode and the reflecting pixel electrode, wherein an auxiliary capacitance is formed between the drain electrode and the auxiliary capacitance electrode, and wherein the drain electrode occupies at least 50% of a pixel region.

28. A display device comprising:

a semiconductor island provided over a substrate and comprising therein a source region, a drain region, and a channel formation region provided between the source region and the drain region;

a gate electrode provided adjacent to the channel formation region with a gate insulating film therebetween;

a source wiring line and a gate wiring line arranged like a lattice, the source wiring line being connected to the source region, and the gate wiring line being connected to the gate electrode;

a drain electrode connected to the drain region and formed at the same time as the source wiring line;

an auxiliary capacitance electrode disposed over the drain electrode through a dielectric film;

a conductive film for electromagnetic shield disposed over the auxiliary capacitance electrode; and a reflecting pixel electrode disposed over the conductive film and the drain electrode with an interlayer insulating film between the drain electrode and the reflecting pixel electrode, wherein an auxiliary capacitance is formed between the drain electrode and the auxiliary capacitance electrode, wherein the drain electrode occupies at least 50% of a pixel region, and wherein flatness of a surface on which the dielectric film is formed, is secured by the gate electrode, the source wiring line, and the drain electrode.

29. A display device comprising:

a semiconductor island provided over a substrate and comprising therein a source region, a drain region, and a channel formation region provided between the source region and the drain region;

a gate electrode provided adjacent to the channel formation region with a gate insulating film therebetween;

a source wiring line and a gate wiring line arranged like a lattice, the source wiring line being connected to the source region, and the gate wiring line being connected to the gate electrode;

a drain electrode connected to the drain region and formed at the same time as the source wiring line;

an auxiliary capacitance electrode disposed over the drain electrode through a dielectric film;

a conductive film for electromagnetic shield disposed over the auxiliary capacitance electrode; and a reflecting pixel electrode formed over the conductive film and the drain electrode with an interlayer insulating film between the drain electrode and the reflecting pixel electrode, wherein an auxiliary capacitance is formed between the drain electrode and the auxiliary capacitance electrode, wherein the drain electrode occupies at least 50% of a pixel region, and wherein a difference in thickness among the gate electrode, the source wiring line, and the drain electrode is not larger than 20% of a thickness of a liquid crystal layer.

* * * * *